(12) United States Patent
Lu et al.

(10) Patent No.: US 10,194,234 B2
(45) Date of Patent: Jan. 29, 2019

(54) CANCELATION OF INDUCED GROUND NOISE IN A HEADPHONE OUTPUT

(71) Applicant: QUALCOMM Incorporated, San Diego, CA (US)

(72) Inventors: Jingxue Lu, San Diego, CA (US); Vijayakumar Dhanasekaran, San Diego, CA (US); Meysam Azin, San Diego, CA (US); Arash Mashayekhi, San Diego, CA (US); Kshitij Yadav, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/613,871

(22) Filed: Jun. 5, 2017

(65) Prior Publication Data
US 2018/0352321 A1   Dec. 6, 2018

(51) Int. Cl.
*H04R 1/10* (2006.01)
*H03F 3/183* (2006.01)
*H04R 1/06* (2006.01)

(52) U.S. Cl.
CPC ........... *H04R 1/1091* (2013.01); *H03F 3/183* (2013.01); *H04R 1/06* (2013.01)

(58) Field of Classification Search
CPC ...... H04R 1/1083; H04R 5/04; H04R 1/1041; H04R 1/06; H04R 1/10; H04R 5/00; H04R 29/00; H04S 1/007; H03G 3/00; H04B 15/00; H03F 3/181; H03F 1/305; H02H 9/045; G10K 11/178
USPC ......... 381/28, 58, 71.6, 74, 94.1, 94.5, 94.6, 381/107, 120, 370, 384; 330/149, 258; 324/119, 120, 123 R, 126, 127; 455/298
See application file for complete search history.

(56) References Cited

U.S. PATENT DOCUMENTS

| 4,979,218 | A * | 12/1990 | Strahm ................. H03H 11/32 330/258 |
| 6,249,411 | B1 * | 6/2001 | Hemena ................. H02J 1/108 361/18 |
| 7,769,187 | B1 * | 8/2010 | Farrar .................. H04R 1/1041 381/384 |
| 8,744,094 | B2 | 6/2014 | Poulsen et al. |
| 8,925,807 | B2 | 1/2015 | Utley et al. |
| 9,020,162 | B2 | 4/2015 | Sander et al. |
| 9,740,225 | B1 * | 8/2017 | Wong ..................... G05F 1/575 |
| 2004/0140854 | A1 * | 7/2004 | Veal .................... H03F 3/45928 330/258 |
| 2009/0180629 | A1 * | 7/2009 | Sander .................. H04M 1/05 381/58 |

(Continued)

OTHER PUBLICATIONS

Nogawa M., "LDO Noise Examined in Detail", Power Management, Texas Instruments Incorporated, 2012, pp. 14-20.

*Primary Examiner* — Vivian Chin
*Assistant Examiner* — Friedrich W Fahnert
(74) *Attorney, Agent, or Firm* — Hunter Clark PLLC (57) ABSTRACT

An example apparatus includes an output jack including a ground pole and a power output pole, a power supply circuit configured to generate a power signal, a coupler circuit operably coupled to the ground pole and the power output pole of the output jack, such that the coupler circuit is configured to couple the power signal with a noise signal on the ground pole to generate a combined output signal on the power output pole.

30 Claims, 10 Drawing Sheets

(56) References Cited

U.S. PATENT DOCUMENTS

2013/0121504 A1* 5/2013 Adams .................. H04R 3/005
                                                    381/92
2014/0340058 A1   11/2014 Wang
2017/0302172 A1* 10/2017 Peretz .................. H02M 3/156
2017/0322575 A1* 11/2017 Du ......................... G05F 1/575

* cited by examiner

FIG. 9 ns
CANCELATION OF INDUCED GROUND NOISE IN A HEADPHONE OUTPUT

BACKGROUND

The present disclosure relates generally to a mobile device with multiple communication capabilities, and more specifically, to an interface unit of the mobile device. Mobile devices may provide multiple communication capabilities including communication between the mobile device and an auxiliary device coupled to the mobile device. A headphone output (e.g., 3.5 mm jack, USB) on the mobile device may be configured to send and/or receive analog and digital data with auxiliary devices such as acoustic, optical and electromagnetic devices (e.g. FM radio transmitter, credit card readers, audio and video signals, etc.). In some cases, the presence of an audio signal may create interference (e.g., noise) on other communications over the headphone interface. One cause of the interference may be the use of a shared ground.

SUMMARY

An example of an apparatus for reducing an impact of ground noise on an auxiliary device power input according to the disclosure includes an output jack including a ground pole and a power output pole, a power supply circuit configured to generate a power signal, a coupler circuit operably coupled to the ground pole and the power output pole of the output jack, such that the coupler circuit is configured to couple the power signal with a noise signal on the ground pole to generate a combined output signal on the power output pole.

Implementations of such an apparatus may include one or more of the following features. The power supply circuit may include a first Low Drop Out regulator (LDO) circuit and an output capacitor. The coupler circuit may include a second LDO circuit operably coupled to an input of the first LDO circuit and the ground pole. The output jack may include at least one audio signal pole. The output jack may be a 3.5 mm phono jack. A connector configured to couple to a mobile device, such that the connector includes a ground line and a power input line may be included. The ground line may be operably coupled to the ground pole of the output jack, and the power input line is operably coupled to the power supply circuit. The power signal may be digitally modulated such that a first voltage value represents a first binary value and a second voltage value represents a second binary value.

An example of a method of providing power to an auxiliary device via a headphone output according to the disclosure includes generating a power output voltage, detecting a ground noise voltage on a ground pole of the headphone output, coupling the ground noise voltage to the power output voltage, generating a combined output based on the power output voltage and the ground noise voltage, and providing the combined output to a microphone pole of the headphone output.

Implementations of such a method may include one or more of the following features. Generating the power output voltage may include controlling a reference voltage input with a first Low Drop Out regulator (LDO) circuit including a negative feedback loop. Generating the combined output may include providing an output of a second LDO circuit as the reference voltage input to the first LDO circuit, such that the output of the second LDO circuit is operably coupled to first LDO circuit and the ground pole via a voltage divider. Providing an audio signal to the headphone output. Modulating the power output voltage, such that a modulated power output includes at least a first voltage value to represent a first binary value and a second voltage value to represent a second binary value. Connecting to a mobile device with a connector, such that the connector includes a ground line and a power line. The headphone output may be a 3.5 mm phono jack and the connector is compatible with a digital connection port.

An example of an apparatus for providing power to an auxiliary device according to the disclosure includes means for generating a power output voltage, means for detecting a ground noise voltage on a ground pole of a headphone output, means for coupling the ground noise voltage to the power output voltage, means for generating a combined output based on the power output voltage and the ground noise voltage, and means for providing the combined output to a microphone pole of the headphone output.

An example of an output adapter for providing power to an auxiliary device according to the disclosure includes a connector configured to operably couple to a mobile device, an adapter module operably coupled to the connector, such that the adapter module includes an output jack including a ground pole and a power output pole, a power supply circuit configured to generate a power signal, a coupler circuit operably coupled to the ground pole and the power output pole of the output jack, such that the coupler circuit is configured to couple the power signal with a noise signal on the ground pole to generate a combined output signal on the power output pole.

Implementations of such an output adapter may include one or more of the following features. The power supply circuit may include a first Low Drop Out regulator (LDO) circuit and an output capacitor. The coupler circuit may include a second LDO circuit operably coupled to an input of the first LDO circuit and the ground pole. The output jack may include at least one audio signal pole. The output jack may be a 3.5 mm phono jack. The connector may include a ground line and a power input line. The ground line may be operably coupled to the ground pole of the output jack, and the power input line may be operably coupled to the power supply circuit. The connector may include a digital signal lane, and the power signal is digitally modulated based on a signal on the digital signal lane.

An example of an apparatus may include a jack comprising at least a first connection configured to couple to a ground and a second connection configured to couple to an output signal, a low drop out regulator (LDO) configured to generate the output signal, and circuitry configured to couple a signal at the first connection to an input of the LDO. The LDO may be configured to generate the output signal based on a reference voltage supplied at the input. The apparatus may further include a second LDO configured to supply the reference voltage. The apparatus may further include a first resistor coupled between an output of the second LDO and the input of the LDO and/or a second resistor coupled between the first connection and the input of the LDO. The apparatus may further include an inductor coupled between an output of the LDO and the second connection. The jack may be a headphone jack. The first connect ion may be configured to couple to a ground conductor in a headphone cable and/or the second connection may be configured to couple to a microphone conductor in the headphone cable.

Items and/or techniques described herein may provide one or more of the following capabilities, as well as other capabilities not mentioned. An auxiliary device may be connected to a mobile device via an output connection (e.g., output jack). The mobile device may provide power to the auxiliary device. The output connection may include audio and digital signals as well as a ground line. The output connection may provide a reference voltage to the auxiliary device. A low-drop out regulator (LDO) circuit in the mobile device may be used to provide the reference voltage to the auxiliary device. A digital signal may be modulated and encoded based on the reference voltage (e.g., 2.85V reference voltage +/−0.2V for 0 and 1 respectively). Noise on the ground of the output connection may be detected. The noise may be coupled to the output of the LDO circuit. In an example, an additional LDO circuit may be used to couple the ground noise to the output of the LDO circuit. The differential between the ground and the reference signal can be reduced. Ground induced currents may be reduced. Data rates may be increased and transmission errors may be decreased. Other capabilities may be provided and not every implementation according to the disclosure must provide any, let alone all, of the capabilities discussed. Further, it may be possible for an effect noted above to be achieved by means other than that noted, and a noted item/technique may not necessarily yield the noted effect.

DETAILED DESCRIPTION

Techniques are discussed herein for providing analog and/or digital signals using a mobile device output. For example, a mobile device may provide analog and digital signals to active noise cancelation (ANC) headphones. A 3.5 mm output jack may be used for communications between slave and master chips to support an ANC headphone with the benefit of minimizing the cost of the ANC headphone. Power and data can be provided to the headphone via a microphone line. The analog and digital outputs may share a common ground. The headphone audio may introduce ground noise on the microphone line due to the ground sharing. The ground noise may consume a significant amount of current and may cause supply ripple which may impact the slave power supply. The current may be sufficient to cause an overcurrent protection on a power supply to trigger. The ground noise may also interfere with the digital communication. For example, a voltage threshold value (e.g., 2.85V) may be required for a digital link. The ground current may cause this value to fall below an acceptable value and interrupt the digital link.

One approach to help reduce the impact of the ground sharing issue includes implementing a ground noise cancellation technique. In an example, the ground noise caused by the audio signals is detected and then coupled to the output of the power supply. In general, the technique couples the ground noise (i.e., the noise voltage) to the output of the slave device power supply in the mobile device (e.g., a LDO). If the noise is coupled directly by a 1:1 ratio, then the differential between the ground noise the microphone line output may be reduced to a value near zero. As a result, the current created by audio outputs will be added to into the microphone line output. The coupling and combining essentially creates a high impedance path between the ground and the microphone line output. The coupling also helps ensure that an auxiliary device power input will receive an expected voltage (e.g., 2.85V or other expected voltage) over the microphone line output.

Figure 1:
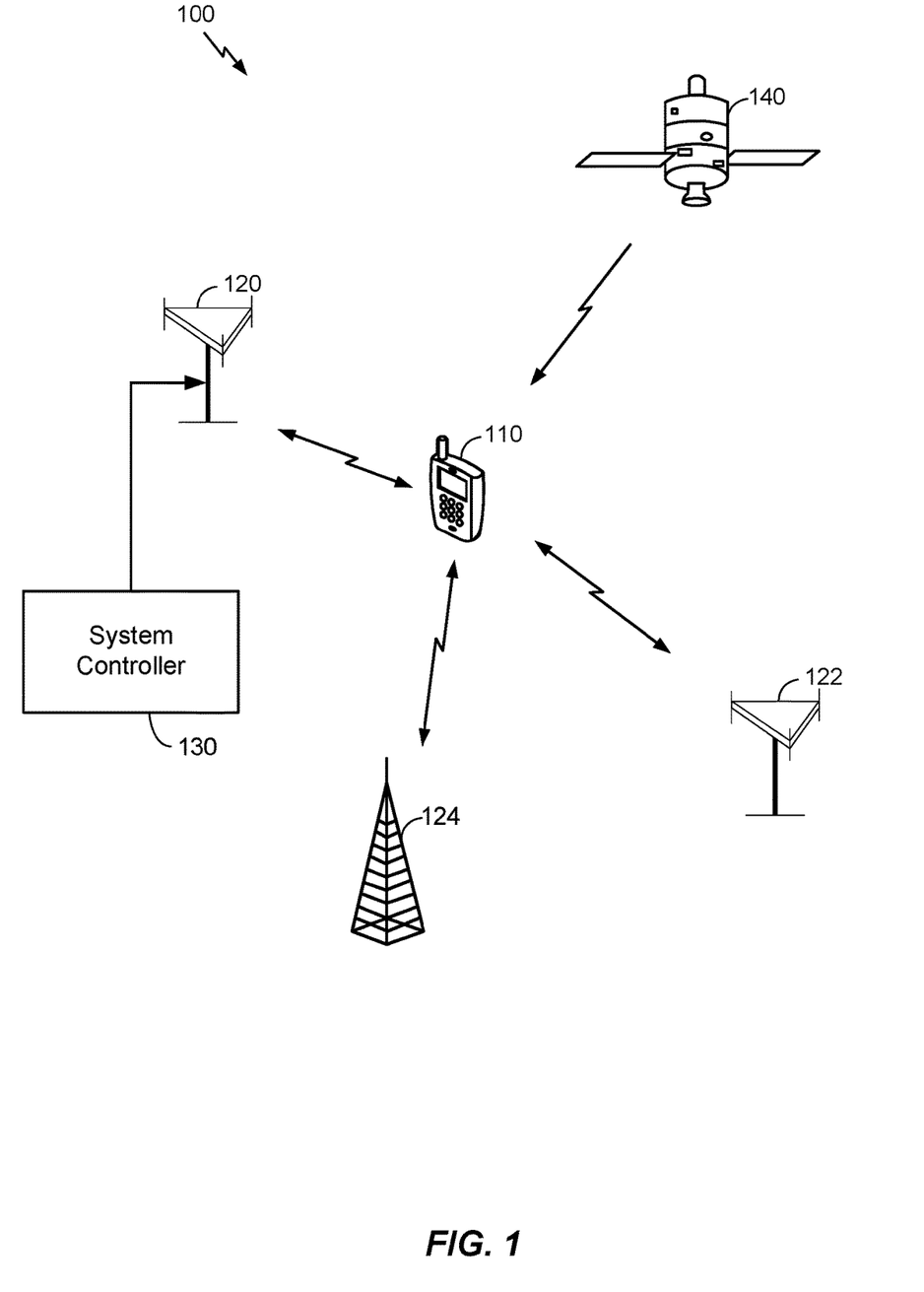
FIG. 1 is an example of a mobile device communicating with a wireless communication system.

Referring to FIG. 1, an example of a mobile device 110 communicating with a wireless communication system 100 is shown. Wireless communication system 100 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA IX, Evolution-Data Optimized (EVDO), Time Division Synchronous CDMA (TD-SCDMA), or some other version of CDMA. For simplicity, FIG. 1 shows wireless communication system 100 including two base stations 120 and 122 and one system controller 130. In general, a wireless system may include any number of base stations and any set of network entities.

Mobile device 110 may also be referred to as a user equipment (UE), a mobile station, a terminal, an access terminal, a subscriber unit, a station, a wireless device, etc. Mobile device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Mobile device 110 may communicate with wireless system 100. Mobile device 110 may also receive signals from broadcast stations (e.g., broadcast station 124), signals from satellites (e.g., satellite 140) in one or more global navigation satellite systems (GNSS), etc. Wireless device 110 may support one or more radio technologies for wireless communication including LTE, WCDMA, CDMA IX, EVDO, TD-SCDMA, GSM, 802.11, etc. In some embodiments, the device 110 wirelessly communicates with a Wide Area Network (for example, an LTE, GSM, and/or CDMA system as described above), a Local Area Network (for example, a WiFi network including any network implemented pursuant to IEEE 802.11), and/or a Personal Area Network (for example, pursuant to a Bluetooth, near-field communication, or other such network). In other embodiments, the device 110 may not be configured to wirelessly communicate with any network.

Figure 2:
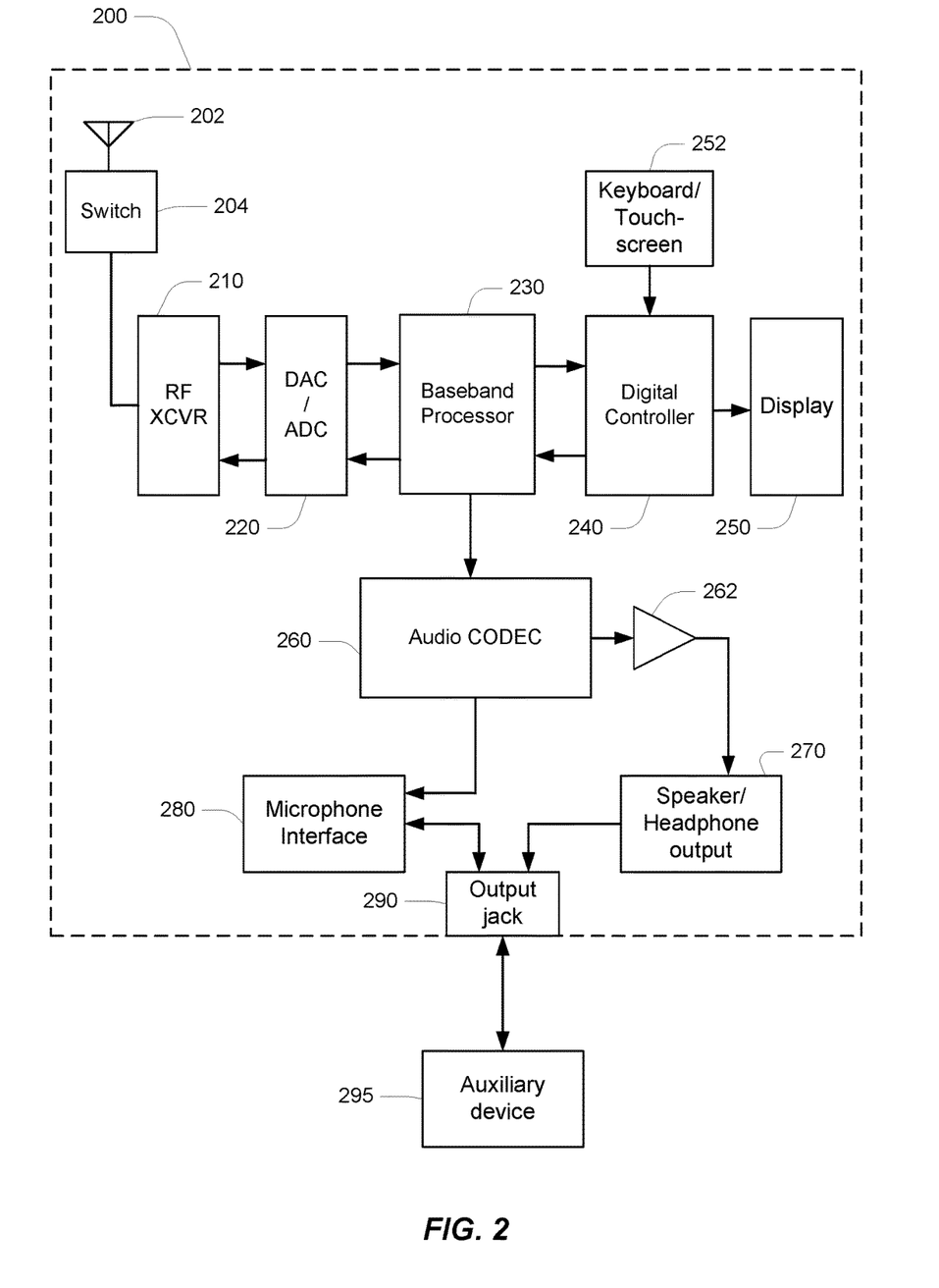
FIG. 2 is a block diagram of a design of an example mobile device.

Referring to FIG. 2, a block diagram of a design of an example mobile device 200 is shown. The mobile device 200 is one embodiment of the mobile device 110 in FIG. 1. The mobile device 200 includes an antenna 202, a switch 204, a radio frequency (RF) transceiver unit 210, a digital-to-analog converter (DAC)/analog-to-digital converter (ADC) 220, a baseband processor 230, a digital controller 240, a display unit 250, and a keyboard/touch screen 252. The mobile device 200 may also include an audio codec 260 having an audio amplifier, an external amplifier 262, and a speaker/headphone output 270. The speaker/headphone output 270 may include or be operably coupled to an output jack 290, such as a 3.5 mm phono jack (e.g., miniphono). In other embodiments, the output jack 290 may be a USB port, mini USB port, micro USB port, USB type-C port, Apple Lightning® port, or other type of interface configured to carry analog and/or digital signals utilizing a reference voltage and a common ground. In an example, the output jack 290 includes multiple plug configurations such as in an adapter to convert a digital audio output (e.g., Apple Lightning®) to an analog output (e.g., phono jack). The components in the mobile device 200 described herein may be disposed within single form (e.g., within the case of the mobile device), or they may be disposed in one or more additional peripheral devices configured to connect to the mobile device 200 (e.g., within an adapter). Other components may also be included within, or connected to, the mobile device 200. Those of skill in the art will understand that functions illustrated by the blocks in FIG. 2 may be combined or separated as appropriate. For example, the DAC/ADC 220 may be included in the transceiver unit 210 or the processor 230, and the amplifier 262 may be incorporated in the output 270 instead of being separately or externally implemented in some embodiments. Further, element of the transceiver unit 210 may be separated out into different modules, for example LNA and/or PA modules.

The mobile device 200 may include a microphone interface 280 configured to interface with an auxiliary device such as the auxiliary device 295 connected to the output jack 290. The microphone interface 280 may include power, clock, and logic components configured to provide a reference voltage, a digital signal, and/or power to the auxiliary device 295. The speaker/headphone output 270, the microphone interface 280 and the output jack 290 may be combined into one or more modules. In an example, the microphone interface 280 may be included in the audio codec 260. The mobile device 200 may further include other units (not shown) including a universal serial bus unit (USB), a camera, a wireless network interface unit, a subscriber identity module (SIM) card, a battery, memory unit, etc. It should be noted that not all blocks of the wireless device in FIG. 2 are necessary. For example, the external amplifier 262 may be removed from some configurations, and the speaker/headphone output may be included in the audio codec 260.

The RF transceiver unit 210 includes transmitter circuitry and receiver circuitry. The mobile device 200 uses the transmitter circuitry and the receiver circuitry to communicate with other wireless devices. The transmitter circuitry transmits radio signals and the receiver circuitry receives the radio signals. The transmitter circuitry includes, among other units, an RF up converter that converts modulated baseband signal (e.g., I and Q) either at zero Intermediate frequency (IF) or some IF to RF frequency. The receiver circuitry includes, among other units, an RF down converter that converts RF signal to baseband signal (e.g., I and Q).

The antenna 202 may be a metallic object which converts electro-magnetic signal to electric signal and vice versa. Example antennas in the wireless device are of various types such as helix type, planar inverted type, whip or patch type. Micro-strip based patch type of antennas are often used in mobile devices/phones due to its size, easy integration on the PCB, and multi-frequency band of operation. Since one antenna may be used for both transmit (Tx) and receive (Rx) paths at different times, a Tx/Rx switch 204 may be used to connect both the Tx path and the Rx path with the antenna 202 at different times. For a frequency division duplex (FDD) system, a diplexer may be used in place of the switch which acts as filter to separate various frequency bands. While not shown, a plurality of antennas may be used in the device 200.

The DAC/ADC 220 may be used to convert the received analog signal to the digital signal and vice versa in the mobile device 200. In the Rx path, a speech signal converted into a digital signal may be sent to the speech coder such as the audio codec 260. The types of ADCs include sigma delta, flash, dual slope, and successive approximation. Automatic gain control (AGC) and automatic frequency control (AFC) may be used to control gain and frequency. The AGC controls proper maintenance of the DAC by keeping the signal within the dynamic range of the DAC. The AFC controls receiver performance by maintaining the frequency error within a limit.

The baseband processor 230 may convert voice/data to baseband signal. The baseband processor 230 is sometimes referred to as a physical layer (or Layer 1). The baseband processor 230 may add redundant bits to enable error detection (e.g., using cyclic redundancy check (CRC)) and error correction using forward error correction techniques (e.g., a convolutional encoder (used in the Tx path) and a Viterbi decoder (used in the Rx path). The baseband processor 230 may also perform power management and distribution functions.

The audio codec 260 may be used to compress and decompress the signals to match the data rate to the frame. The audio codec 260 may convert the speech signal at 8 KHz sampling rate to 13 kilobits per second (kbps) rate for a full rate speech traffic channel. The audio codec 260 may couple to the speaker and/or headphone output 270 through the external amplifier 262. The audio codec 260 may also couple to the output jack 290 through the microphone interface 280. In an example, audio codec 260 may include the microphone interface 280. The digital controller 240 may control data input and output signals such as switching and driving applications, commands, memory accesses, and executions of programs. The digital controller 240 may also interpret and execute commands to and from the user interface including the display unit 250, the keyboard/touchscreen 252, etc. The digital controller 240 may further manage and execute various applications in an application layer (Layer 7). Applications may include audio, video and image/graphics applications.

Figure 3:
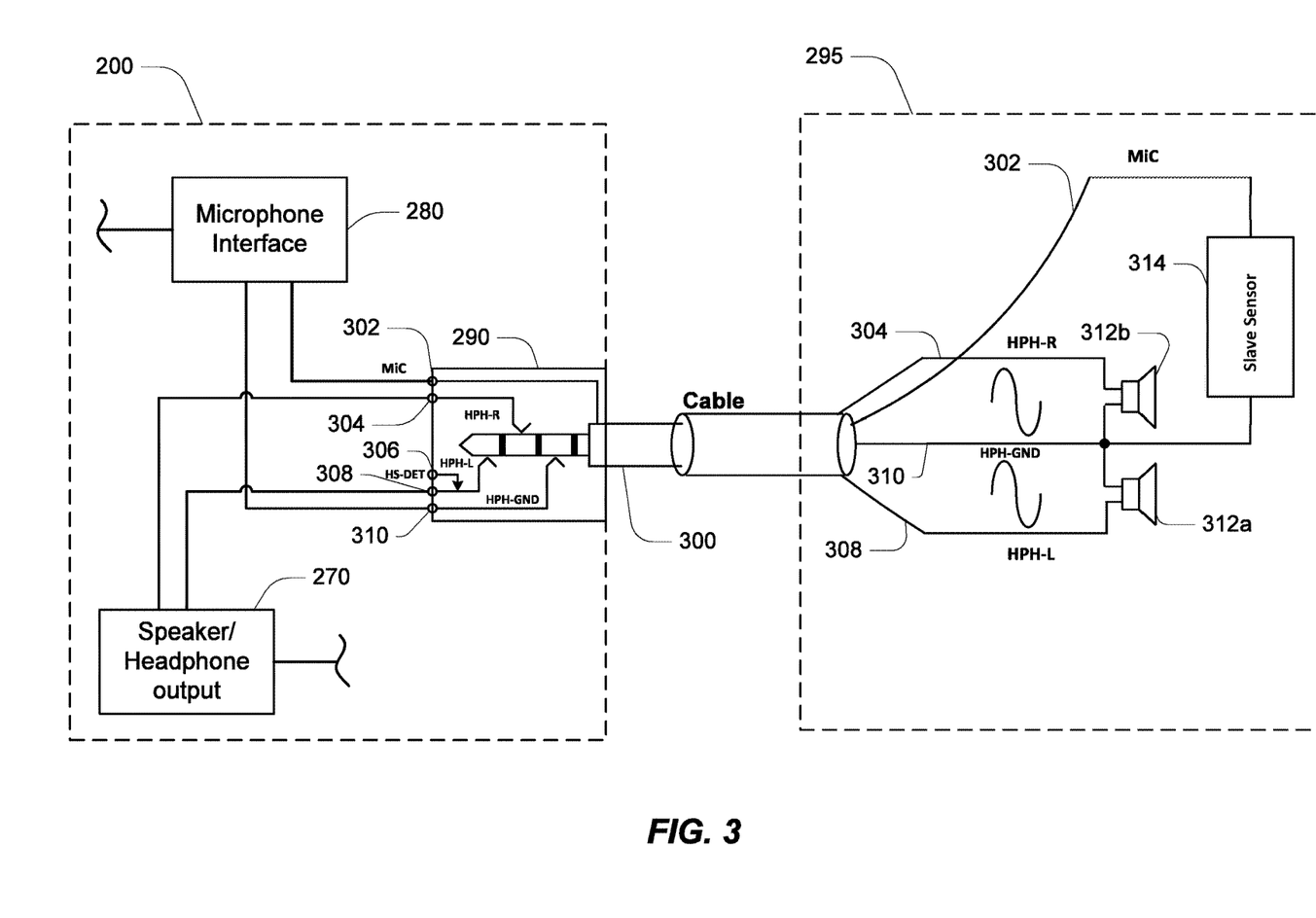
FIG. 3 is a block diagram of a mobile device and an example auxiliary device.

Referring to FIG. 3, a block diagram of a mobile device 200 and an example auxiliary device 295 is shown. The mobile device 200 includes the speaker/headphone output 270, the microphone interface 280, and the output jack 290. In an example, the auxiliary device 295 is a set of ANC headphones and includes a cable 300 with a four ring phono plug (e.g., 3.5 mm phono plug) that is connected to the output jack 290. The output jack 290 may include at least one audio signal pole. For example, the conductors in the cable 300 include a microphone line 302 (i.e., MIC), a headphone right line 304 (i.e., HPH-R), a headphone left line 308 (i.e., HPH-L) and a ground 310 (i.e., HPH-GND). The output jack 290 may include a headphone detect input 306 (i.e., HS-DET) that is operably connected to the speaker/headphone output 270 or the audio codec 260. The microphone interface 280 is operably coupled to the microphone line 302 and the ground 310. The speaker/headphone output 270 is operably coupled to the right and left headphone lines 304, 308. In an example, the microphone line 302 may function as a power output pole in the output jack 290. While not explicitly illustrated in FIG. 3, elements in the output 270 configured for providing audio to the lines 302 and/or 308 may share a ground (e.g., the line 310) with the microphone interface 280 in some embodiments.

The auxiliary device 295 includes a left speaker 312a, a right speaker 312b, and slave sensor 314. In the ANC headphone example, the slave sensor 314 receives power and digital information via the microphone line 302 (e.g., a power output pole). The speakers 312a-b receive audio input via the corresponding right and left headphone lines 304, 308. The slave sensor 314 and the speakers 312a-b utilize the ground 310.

In some embodiments, the output jack 290 on the mobile device 200 is used to provide power and/or digital communications to/with the auxiliary device 295. The microphone interface 280 or audio codec 260 may provide the power and data inputs, which are combined on the microphone line 302. This may mean that only one line is used to transmit the power as well as clocking and digital data. In an example, power is at a reference voltage, and the data may be encoded as changes to that voltage. A typical ANC headphone may receive a 2.85V reference voltage, and changes of +/−0.2V may be used to represent a first binary value and a second binary value (e.g., binary data bits, 1 and 0). For example, a first voltage value may be used to represent the first binary value, and a second voltage value may be used to represent the second binary value. A practical issue associated with mobile devices is that the ground path for the output jack 290 may not be directly coupled to the common ground within the mobile device and there may be several components that contribute resistance on the ground path. For example, Radio Frequency (RF) chokes may be included in the microphone interface 280 if the output jack 290 is also used for radio reception (e.g., using a headphone cord as an antenna). The microphone interface 280 may also include switches to configure the output jack 290 for different regional standards (e.g., U.S., Europe). Such switches may be located on the microphone line 302 and the ground 310 and they may have a finite resistance. These components, and the resistance they create on the ground 310, can impact the power and digital signals on the microphone line 302.

In the ANC headphone example, the ground 310 is shared with the speakers 312a-b and during playback current going to the speakers 312a-b may generate ripple on the ground 310. This additional current also increases the current on the microphone line 302, which receives power from the microphone interface 280 or the audio codec 260. Since the power supply in the microphone interface 280 or the audio codec 260 may include an LDO, the extra current (i.e., ripple) on the ground line and the corresponding current on the microphone line 302 may cause an increase in the current through the LDO. The extra current may be sufficient to trigger the overcurrent safety in the LDO (e.g., 20-50 mA). The additional current in the microphone line 302 may cause performance issues in the auxiliary device. For example, the current could cause the voltage value on the microphone line to drop below a minimum value required for the auxiliary device power input. In another example, fluctuations in the microphone line 302 may disturb the digital data being transmitted over the microphone line 302. For example, zero crossings in the digital data may be modulated by ground noise.

Figure 4:
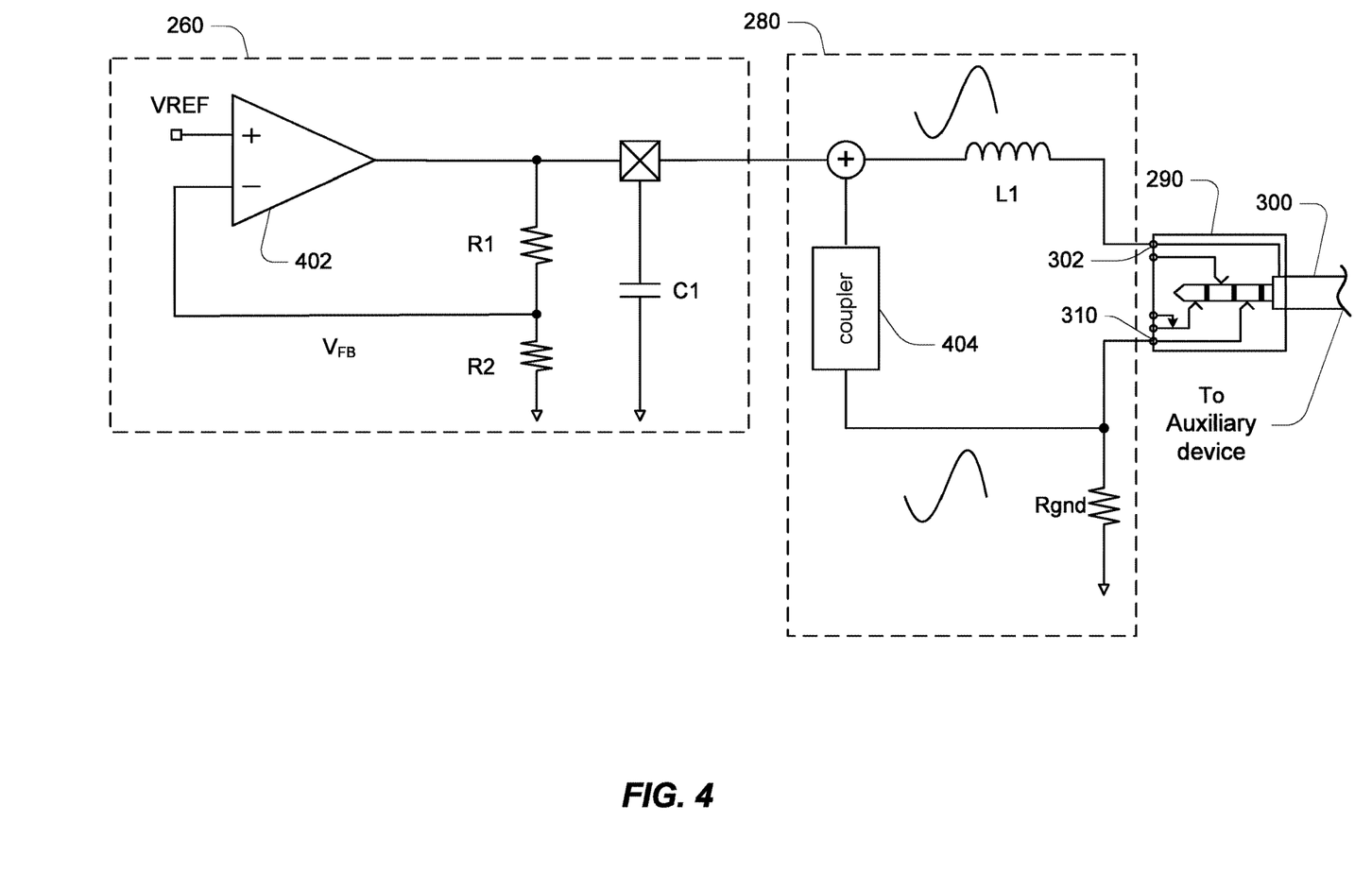
FIG. 4 is a schematic diagram of an example of a coupler to combine a ground signal with an output of a power supply circuit.

Referring to FIG. 4, a schematic diagram of an example of a coupler to combine a ground signal with an output of a power supply circuit is shown. The diagram includes the audio codec 260, the microphone interface 280, and the output jack 290. The components as depicted within the audio codec 260 and the microphone interface 280 are examples only, and not limitations, as the components may be included solely within the audio codec 260, solely within the microphone interface 280, within other modules in the mobile device 200, included in peripheral devices connected to the mobile device 200, or various combinations therein. The cable 300 is connected to the output jack 290 and the auxiliary device 295 (not shown in FIG. 4). The audio codec 260 includes an LDO 402, a first feedback resistor network including R1 and R2, and an output capacitor C1. In the ANC headphone example, the value of C1 may be in the range of 0.1 µF to 100 µF. The LDO 402 may be comprised of an error amplifier and a field effect transistor (e.g., a NFET). The LDO 402 receives a reference voltage input (VREF) from the audio codec 260. The first feedback resistor network divides the LDO output voltage to provide a feedback voltage $V_{FB}$ (e.g., a negative-feedback loop). The LDO provides a voltage to the microphone interface 280. In the ANC headphone example, the output voltage may be approximately 2.85V (+/−2%). The microphone interface 280 includes an inductor L1 and a coupler 404. The resistor Rgnd represents resistance in the ground path of the mobile device 200 (e.g., the finite resistance based on the audio signal). In some applications, the inductor value of L1 may range from 4.0 µH to 30 µH based on the desired ripple current. Other inductance values may also be used. The coupler 404 is configured to couple the ground 310 to the output of the LDO 402. The coupler 404 is a general representation of known coupling techniques such as direct coupling, capacitive coupling and transformer coupling. The coupler 404 generates a combined output signal based on the power output voltage (e.g., from the LDO 402) and the ground noise voltage (e.g., from the ground 310). For example, the coupler 404 directly couples the noise on the ground 310 directly at a ratio of 1:1 with the LDO output. As a result of the coupling, the differential between the combined output signal and the noise on the ground 310 remains relatively constant (i.e., based on the LDO reference voltage). Analyzing the circuit from the ground 310 to the microphone line 302, the coupler 404 creates a high impedance path which reduces or eliminates current flowing from the ground 310 to the microphone line 302. The combined output signal is provided to the microphone line 302 via the output jack 290. The coupling may enable the auxiliary device 295 to receive a desired voltage, and the audio signals (e.g., 304, 308) inducted ground noise to be coupled on top of the power signal (e.g., on the microphone line 302). This has the benefit that the current through the LDO may not be increased beyond a threshold level (e.g., an overcurrent protection trigger value) because of the increased ground current due to the audio signals.

Figure 5:
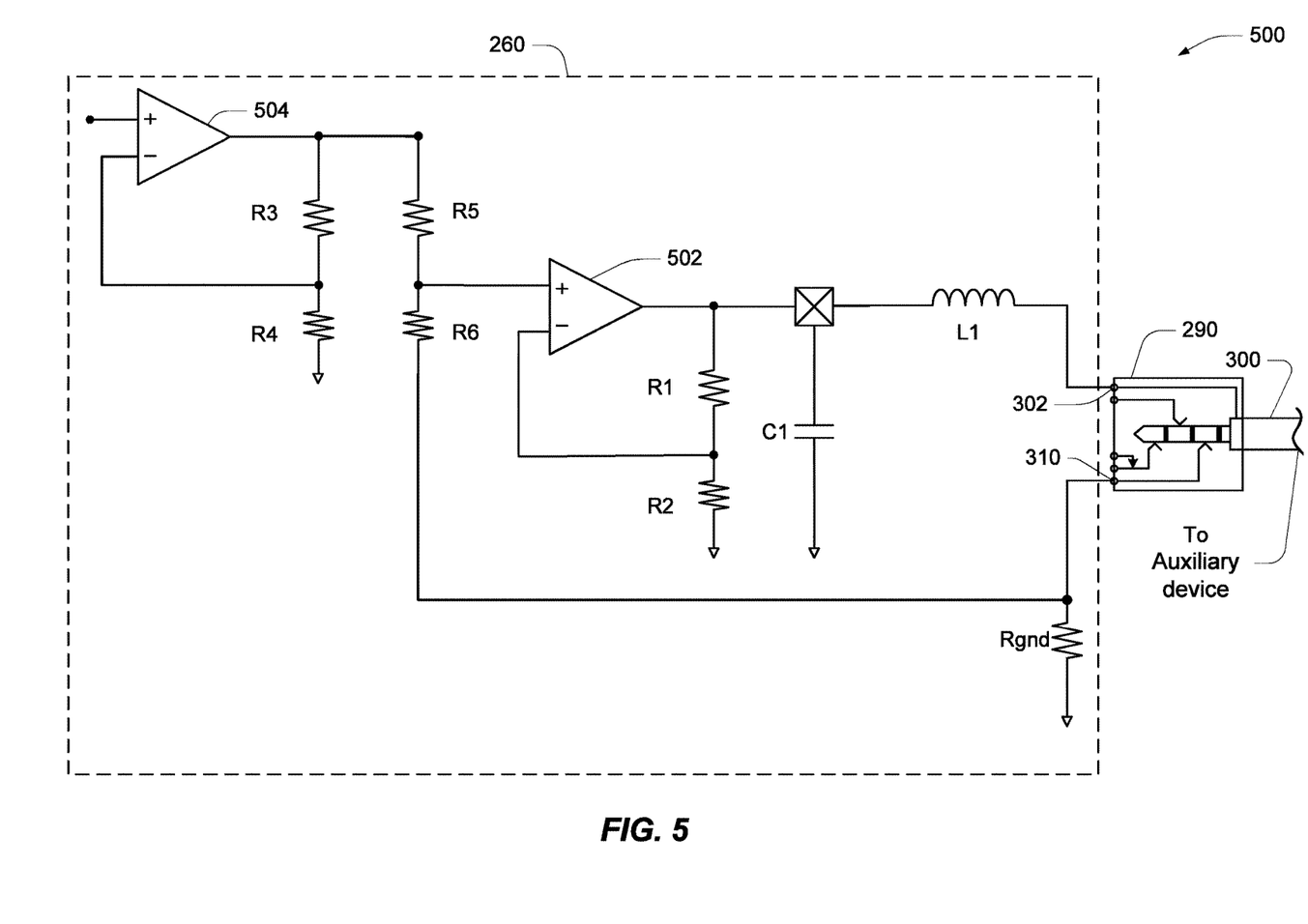
FIG. 5 is a schematic diagram of an example circuit to combine a ground signal with an output of an LDO.

Referring to FIG. 5, a schematic diagram of an example circuit 500 to combine a ground signal with an output of an LDO is shown. In an example, the circuit 500 may be included in the audio codec 260. The circuit 500, or elements of the circuit 500, may be included in other modules of the mobile device 200. For example, elements of the circuit 500 may be included in the microphone interface 280. The circuit 500 is operably coupled to the auxiliary device via the microphone line 302 and the ground 310 of the output jack 290. The circuit 500 includes a first LDO circuit 502 and a second LDO circuit 504. The first LDO circuit 502 may be the same as the LDO 402 in FIG. 4. The first LDO circuit 502 is operably coupled to a first feedback resistor network including R1 and R2, an output capacitor C1 (e.g., in the range of 0.1 µF to 100 µF), and an inductor L1 (e.g., in a range from 4.0 µH to 30 µH). The first feedback network divides the first LDO circuit 502 output to provide a negative-feedback loop to the first LDO circuit 502. The second LDO circuit 504 receives a voltage input from the audio codec 260 and is operably coupled to a second feedback resistor network including R3 and R4, and the first LDO circuit 502 via a voltage divider including R5 and R6. The second feedback resistor network divides the second LDO circuit 504 output to provide a negative feedback loop to the second LDO circuit 504. One end of the voltage divider network is connected to the output of the second LDO circuit 504 and the other end is connected to the ground 310. The resistor R6 is coupled to the ground 310 and Rgnd, where Rgnd represents the resistance in the ground path within the mobile device 200. A center tap (e.g., between R5 and R6) provides an input to the first LDO circuit 502. The second LDO circuit 504 is an example of a means to detect a ground noise voltage on the ground 310. The combination of the first LDO circuit 502 and the second LDO circuit 504 is an example of a means to couple the ground noise voltage on the ground 310 to the output voltage of the first LDO circuit 502, and/or an example of a means to generate a combined output based on the power output voltage and the ground noise voltage. In an example, the first LDO circuit 502 may be a high quality device to ensure the auxiliary device 295 and associated clocking circuitry receive a clean source of power. The second LDO circuit 504 may be of a lesser quality (e.g., lower cost) as compared to the first LDO circuit 502 because it is performing a relatively more tolerant function of providing a combined voltage (e.g., the output of the second LDO circuit 504 and the noise on the ground 310) as an input to the first LDO circuit 502.

As described above, the codec 260 and/or the microphone interface 280 may include power, clock, and logic components configured to provide a reference voltage, a digital signal, and/or power to the auxiliary device 295. FIGS. 4 and 5 have heretofore been described with respect to a power supply. While not previously illustrated, the codec 260 and/or the microphone interface 280 may include circuitry for transmitting and/or receiving data, for example digital data, over the microphone line 302. Such transmitting and/or receiving may utilize a reference on the ground line 310.

Figure 6:
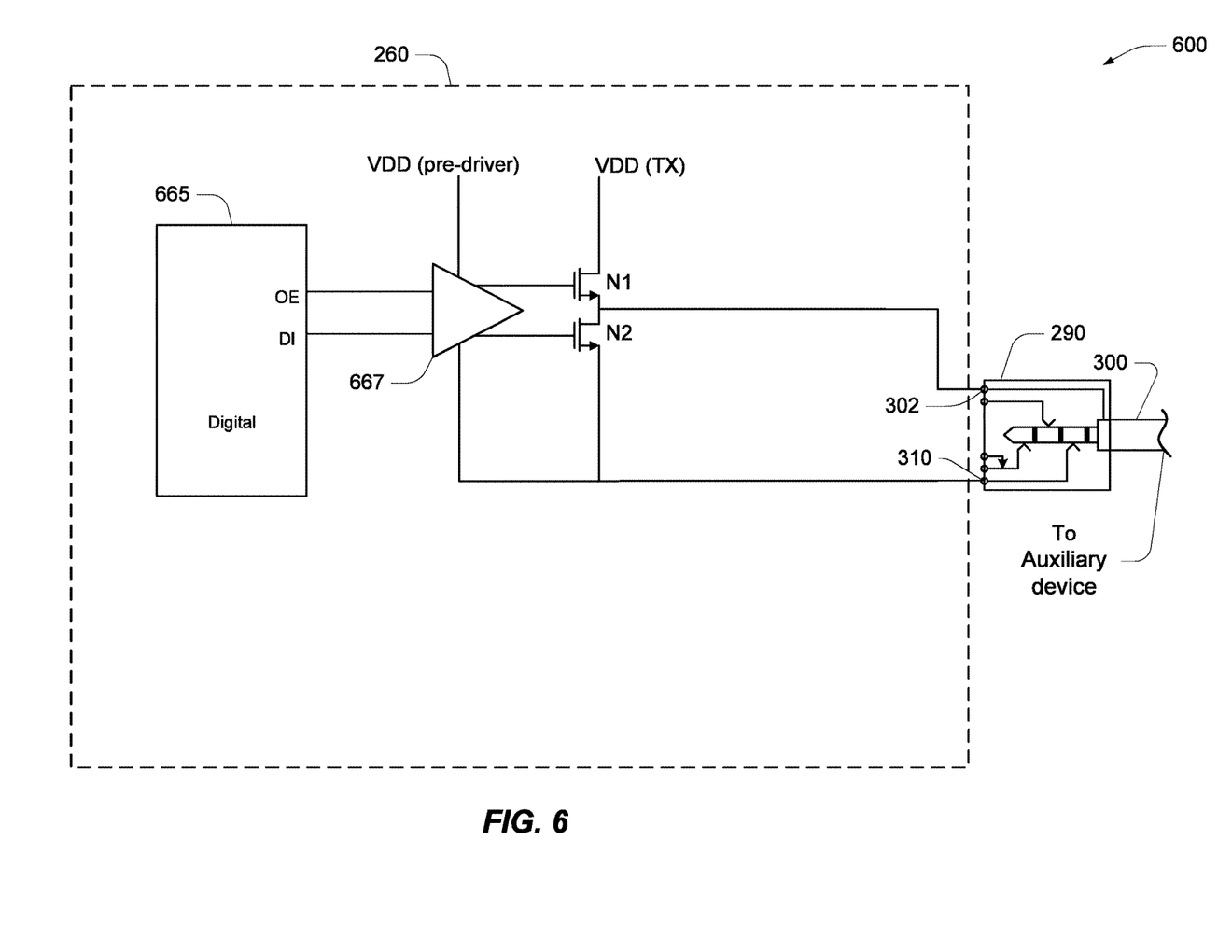
FIG. 6 is a schematic diagram of an example circuit to transmit data.

FIG. 6 illustrates a schematic diagram of an example circuit 600 to transmit data. In an example, the circuit 600 may be included in the audio codec 260. The circuit 600, or elements of the circuit 600, may be included in other modules of the mobile device 200. For example, elements of the circuit 600 may be included in the microphone interface 280. The circuit 600 is operably coupled to the auxiliary device via the microphone line 302 and the ground 310 of the output jack 290. The circuit 600 includes a source 665 of digital data. The digital data, labeled as an OE and DI interface in FIG. 6, is provided to an amplifier 667 from the source 665. The amplifier 667 is coupled to one or more supplies $V_{DD}$ and to the ground 310. In some embodiments, the power supply labeled as $V_{DD}$ in FIG. 6 is the same power supply circuit discussed above with respect to FIG. 4. An output of the amplifier 667 is provided to transistors N1 and N2, which provide a transmit signal to the microphone line 302. A drain of the transistor N1 is coupled to a power supply VDD, which may be the same power supply coupled to the amplifier 667 (e.g., the power supply circuit discussed above with respect to FIG. 4) or a different power supply. Further, a source of the transistor N1 is coupled to a drain of the transistor N2 and provides the output to the microphone line 302. A source of the transistor N2 is coupled to the ground 310. While the circuit 600 is illustrated with N-channel MOSFETs N1 and N2 in FIG. 6, other embodiments may include one or more P-channel MOSFETs. Further, additional elements may be included which are not illustrated. For example, a capacitor may be implemented between the output of the transistors N1 and N2 and the microphone line 302. Similarly, a filter may be implemented between the output of the transistors N1 and N2 and the capacitor.

As can bee seen in FIG. 6, both the amplifier 667 and the transistor N2 are coupled to the ground 310. In some situations the transmission of data causes noise on the line 310, for example due to ground bounce. This may affect data and/or power being provided on the microphone line 302 similar to the ways described above with respect to FIGS. 2-5. One strategy for reducing such noise or bounce is to combine a ground signal with an output of an LDO coupled to the microphone line 302, for example as described above with respect to FIGS. 4 and 5. Thus, while much of the discussion related to the previous figures described ground noise which may be introduced due to audio being provided to the auxiliary device, aspects described with respect to these figures may also address noise introduced by data transmission.

Another strategy for reducing such noise or bounce may include decoupling certain ground nets from the noise. This strategy may be used in addition to or instead of combining a ground signal with an output of an LDO, as described above.

Figure 7A:
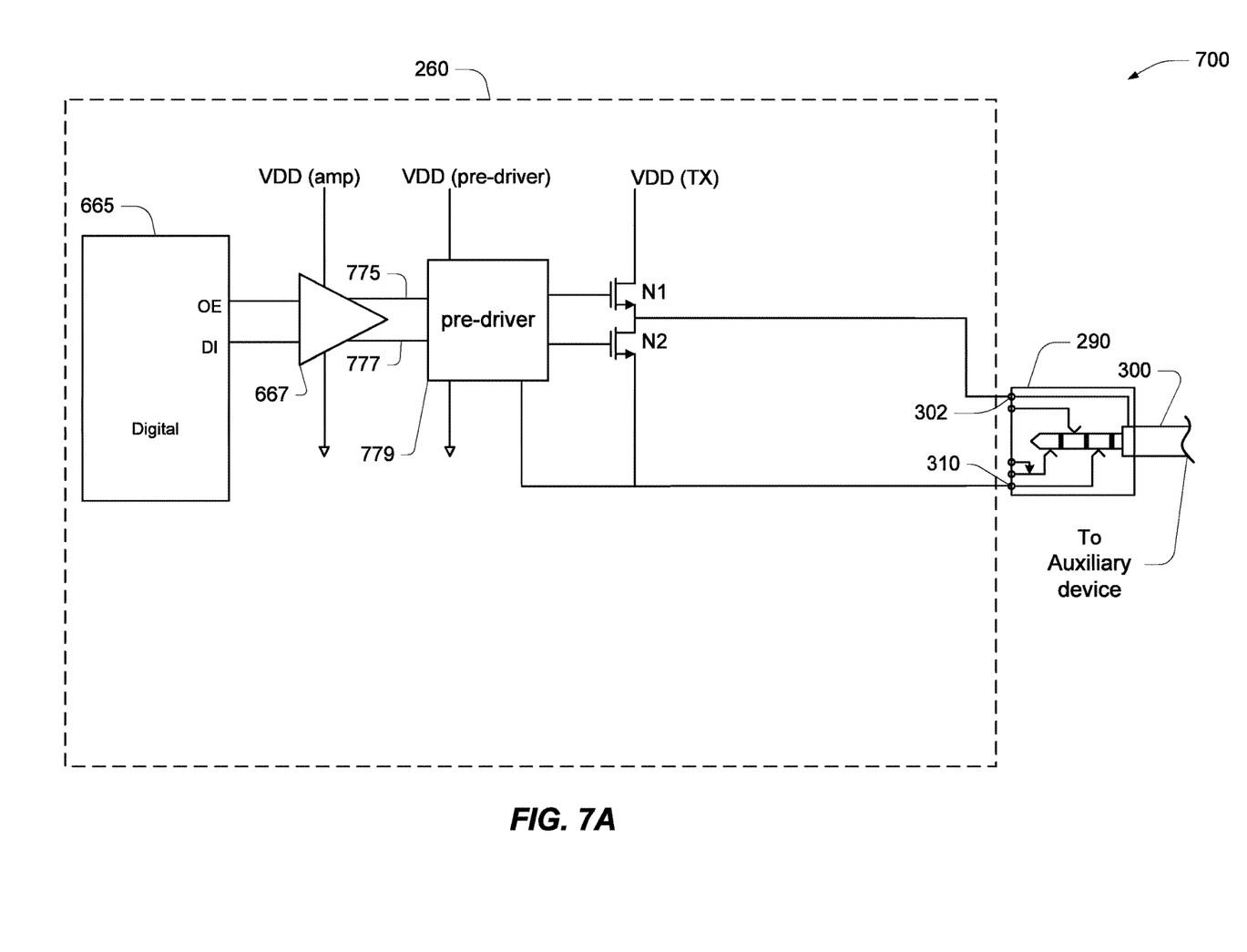
FIGS. 7A and 7B are schematic diagrams of an improved example circuit to transmit data.

FIG. 7A illustrates a schematic diagram of an improved example circuit 700 to transmit data. In an example, the circuit 700 may be included in the audio codec 260. The circuit 700, or elements of the circuit 700, may be included in other modules of the mobile device 200. For example, elements of the circuit 700 may be included in the microphone interface 280. The circuit 700 is operably coupled to the auxiliary device via the microphone line 302 and the ground 310 of the output jack 290. In contrast to the circuit 600 illustrated in FIG. 6, however, the amplifier 667 may be coupled to a ground of the device 200. Further, outputs 775 and 777 of the amplifier 667 may be coupled to a pre-driver 779 and output of the pre-driver 779 may be coupled to the transistors N1 and N2. A portion of the pre-driver 779 may be coupled to a ground of the device 200, while another portion may be coupled to ground 310. The amplifier 667 is coupled to a power supply $V_{DD}$. The pre-driver 779 is also coupled to a power supply $V_{DD}$. In some embodiments, the power supply labeled $V_{DD}$ (amp) is the same as the power supply labeled $V_{DD}$ (pre-driver), which may be a local supply. In some embodiments, the power supply labeled $V_{DD}$ (TX) is the same as the power supply described above with respect to FIG. 4. In some embodiments, the pre-driver 779 comprises a switched capacitor pre-driver. The pre-driver 779 may be configured to couple ground noise to the driver gates.

Figure 7B:
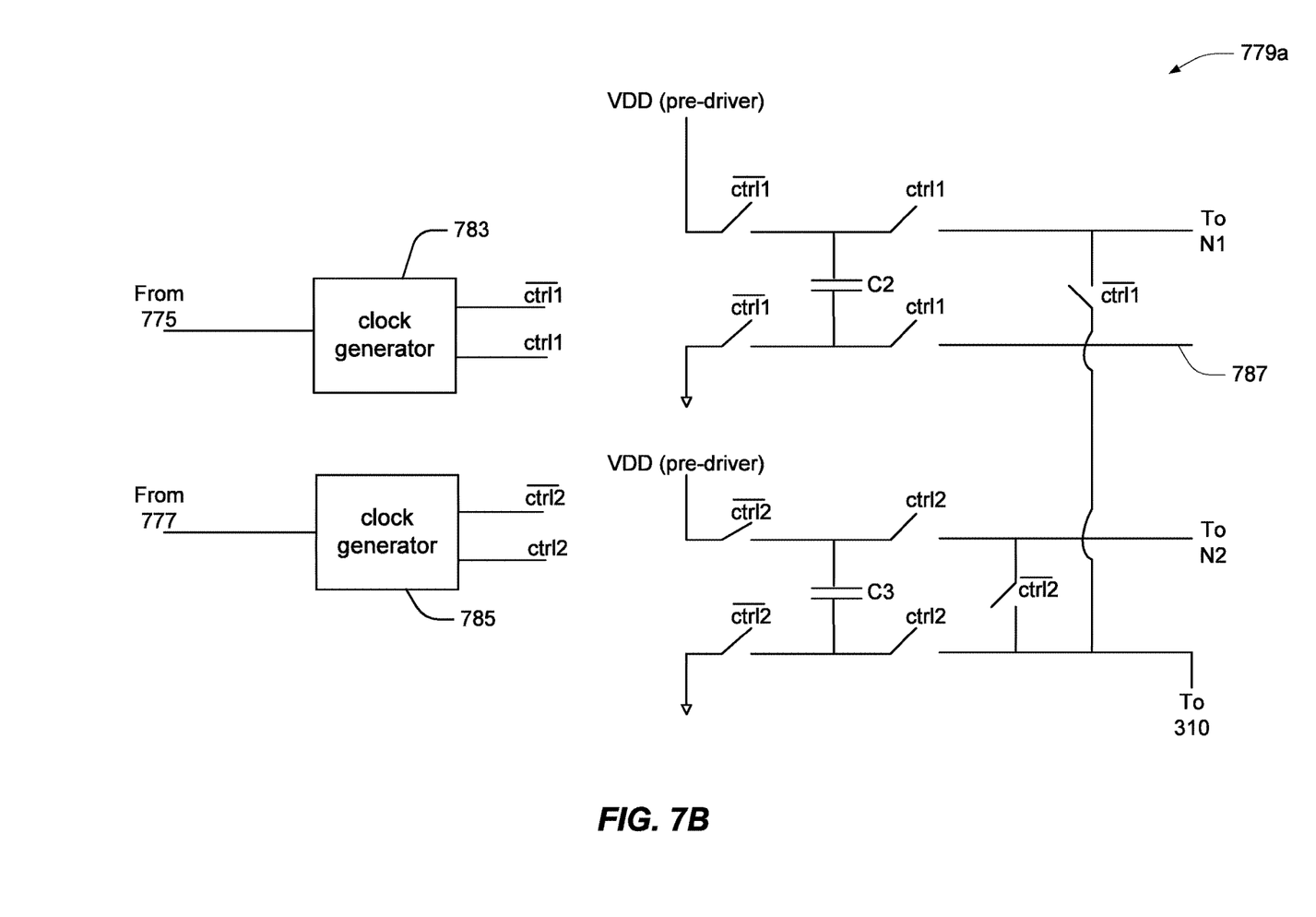

FIG. 7B illustrates a schematic diagram of an example pre-driver 779a. In the illustrated embodiment, the pre-driver 779a is configured as a switched capacitor pre-driver configured to maintain all output switches drive voltages independent of the ground 310. For example, the capacitors C2 and C3 may be switched as described below to achieve such maintenance of the drive voltages. The pre-driver 779a receives the outputs 775 and 777 from the amplifier 667. A clock generator 783 produces control signals ctrl1 and $\overline{ctrl1}$ based on the output 775 to control certain of the switches in the pre-driver 779a as illustrated in FIG. 7B. Similarly, a clock generator 785 produces control signals ctrl2 and $\overline{ctrl2}$ based on the output 777 to control certain of the switches in the pre-driver 779a as illustrated in FIG. 7B. In the embodiment illustrated in FIG. 7B, in addition to the outputs which are coupled to the gates of the transistors N1 and N2 (as indicated in FIG. 7B and illustrated in FIG. 7A), an additional output 787 is implemented. The output 787 may be coupled to a node between the source of the transistor N1 and the drain of the transistor N2. For example, the output 787 may be coupled to the output of the transistors N1 and N2 illustrated in FIG. 7A (which is coupled to the microphone line 302).

In some embodiments, the pre-driver 779 comprises a plurality of slices each configured similar to the example circuit 779a. In such embodiments, each slice may receive the outputs 775 and 777 from the amplifier 667. The respective clock generators in each slice, however, may be configured such that when data is output to the transistors N1 and N2 and ultimately to the microphone line 302 a sinusoidal zero crossing is created, which may reduce jitter and/or electromagnetic interference. For example, eight slices (which may be referred to as eight taps) each including the elements illustrated in FIG. 7B may be implemented to create such sinusoidal zero crossing. In embodiments where there are multiple slices, respective outputs of all the slices may be coupled together so as to provide a single output to the gate of N1 and a different single output to the gate N2. In embodiments having the output 787, all of the outputs 787 of the different slices can be coupled together.

While embodiments above have been described with respect to providing audio, power, and/or data over a jack such as a headphone jack, those of skill in the art will recognize that the concepts herein may be employed in any situation in which one application or element is causing ground noise or bounce for another application or elements. For example, two different circuits which share a ground pin in a device may be configured to combine a ground signal with an output of one of the circuits and/or may be configured to decouple certain ground nets of one of the circuits from the noise.

Figure 8:
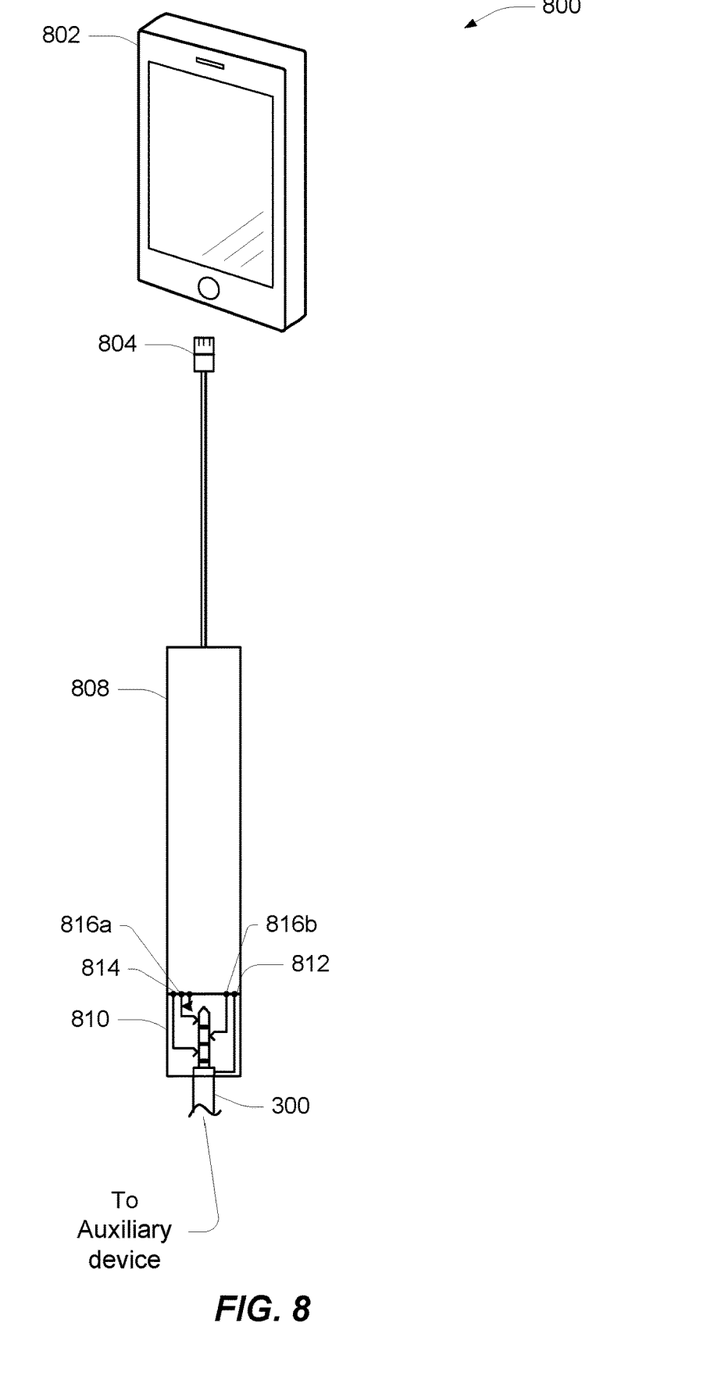
FIG. 8 is a block diagram of an output adapter with a coupler to combine a ground signal with a power output.

Referring to FIG. 8, with further reference to FIGS. 2-7B, an output adapter 800 with a coupler to combine a ground signal with a power output and/or to decouple certain ground nets is shown. A current trend in portable devices is to reduce the number of connection ports in an effort to provide more efficient form factors and improve water resistance. In an example, a mobile device 802 may be constructed with a single digital connection port such as a USB, miniUSB or Apple Lightning® port. A corresponding cable connector 804 is configured to receive a power input and/or data for transmission, and a ground connection via the single port. The connector 804 is a means for connecting to a mobile device and may include one or more digital signal lanes configured to conduct digital signals. For example, the 8 pin Apple Lightning® connector includes a ground pin, a lane 0 positive, a lane 0 negative, an identification control 0, a power input line, a lane 1 positive, a lane 1 negative and an identification control 1. The connector 804 is operably coupled to an adapter module 808 which includes an output jack 810 (e.g., a 3.5 mm phono jack). The output jack 810 includes a microphone line 812 and a ground 814 and left and right audio outputs 816a, 816b respectively. In an embodiment, the adapter module 808 may be a means to generate a combined output signal based on a power output voltage and a ground noise voltage. For example, the adapter module 808 may include circuitry to convert the power and digital input received via the connector 804 into corresponding digital, analog, and/or power signals for the auxiliary device. The adapter module 808 may include a coupler such a described in FIGS. 4 and 5 and/or transmit circuitry as described in FIGS. 6-7B. For example, the ground 814 may be connected to the ground pin in the connector 804 and the corresponding finite resistance (i.e., Rgnd) in the mobile device 802. The power line in the connector 804 may provide a voltage in to an LDO and other circuitry within the adapter. In an example, the adapter module 808 may include a power supply (e.g., a battery, additional power jack). As previously described, the finite resistance on the ground of the mobile device 802 may cause the audio signals to generate a current on the microphone line 812. A coupler (e.g., circuit 500) in the adapter module 808 is configured to couple a signal on the ground 814 to a power output on the microphone line 812.

Figure 9:
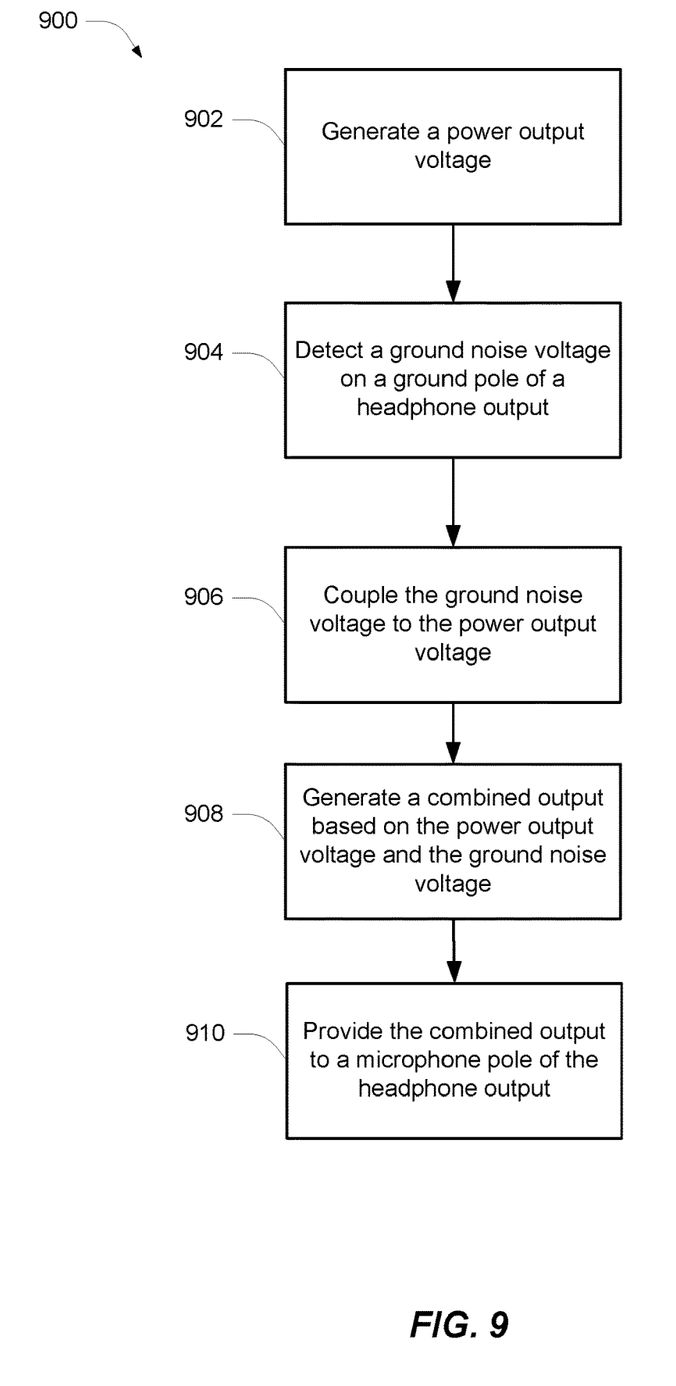
FIG. 9 is a process flow diagram for providing power to an auxiliary device via a headphone output.

Referring to FIG. 9, with further reference to FIGS. 2-8, a process 900 for providing power to an auxiliary device via a headphone output includes the stages shown. The process 900 is, however, an example only and not limiting. The process 900 can be altered, e.g., by having stages added, removed, rearranged, combined, performed concurrently, and/or having single stages split into multiple stages. For example, stage 902 through stage 910 may be performed concurrently with a coupler circuit (e.g., FIGS. 4-8). Still other alterations to the process 900 as shown and described are possible.

At stage 902, a power supply circuit in the mobile device 200, such as the LDO 402, generates a power output voltage. The LDO 402 is a means for generating the power output voltage and the power supply circuit may be a linear voltage regulator with a negative-feedback loop to provide a constant voltage as compared to a reference voltage. The audio codec 260 provides a reference voltage (i.e., VREF) to the LDO 402, and the LDO may output a voltage to the microphone line 302 of the output jack 290. The LDO 402 is an example only, and not a limitation, as other power supplies may be used to generate a power output voltage. In an example, the mobile device 602 may provide power to the connector 604 and the adapter module 608 is configured to generate a power output voltage.

At stage 904, a coupler 404 detects a noise voltage on a ground pole of a headphone output. The coupler 404 is a means for detecting the noise voltage on the ground pole. The ground 310 may include noise associated with audio playback on the right and left headphone lines 304, 308. The finite ground resistance (e.g., Rgnd) in the mobile device 200 causes the audio signals on the headphone lines 304, 308 to generate electrical current in the microphone line 302. The coupler 404 is connected to the ground 310 and is a means to detect a noise voltage on the ground pole of a headphone output. The coupler 404 may be included in the adapter module 608.

At stage 906, the coupler 404 couples the ground noise voltage to the power output voltage. In an example, the coupler 404 is a means for coupling the ground noise voltage to the power output voltage, and may include techniques such as direct coupling, capacitive coupling and transformer coupling. In an example, the first LDO circuit 502 and the second LDO circuit 504 of FIG. 5 may be used. In some applications, a mixer circuit may also be used to combine the two signals. The coupler 404 is configured to combine the ground noise voltage and the power output voltage at a ratio of 1:1. As a result, the differential between the power output signal and the ground noise signal may remain constant based on the value of the reference voltage.

At stage 908, the coupler 404 generates a combined output based on the power output voltage and the ground noise voltage. Referring to FIG. 4, the combined output is generated at the output of the LDO 402 after the output capacitor C1 and includes the output of the LDO 402 and the ground noise on the ground 310. Referring to FIG. 5, the first LDO circuit 502 and the second LDO circuit 504 generate the combined output based on power output voltage (e.g., the output of the first LDO circuit 502) and the ground noise voltage (e.g., the voltage on ground 310). Referring to FIG. 8, the adapter module 808 may be a means to generate a combined output based on the power output voltage and the ground noise voltage.

At stage 910, the microphone interface 280 provides the combined output to a microphone pole of the headphone output. For example, the microphone line 302 on the output jack 290 is the microphone pole of the headphone output. Referring to FIG. 8, the microphone line 812 in the output jack 810 in the adapter module 808 is the microphone pole of the headphone output. The cable 300 includes a four ring phono plug (e.g., 3.5 mm) configured to conduct signals on the microphone line 302, the headphone right line 304 (i.e., HPH-R), the headphone left line 308 (i.e., HPH-L), and the ground 310 (i.e., HPH-GND). In an example, the combined output may be modulated to convey a digital signal to the auxiliary device. In an example, a modulator circuit within the mobile device 200 may be a means for modulating the power output voltage such that a modulated power output includes at least a first voltage value to represent a first binary value and a second voltage value to represent a second binary value. In the ANC headphone example, the combined output may be modulated +/−0.2V relative to the differential between a reference voltage (e.g. 2.85V) and the ground 310.

While the ANC headphone example has been used to demonstrate the ground noise cancelation techniques described herein, the disclosure is not so limited. Other examples and implementations are within the scope and spirit of the disclosure and appended claims. For example, due to the nature of software and computers, functions described above can be implemented using software executed by a processor, hardware, firmware, hardwiring, or a combination of any of these. Features implementing functions may also be physically located at various positions, including being distributed such that portions of functions are implemented at different physical locations.

Also, as used herein, "or" as used in a list of items prefaced by "at least one of" or prefaced by "one or more of" indicates a disjunctive list such that, for example, a list of "at least one of A, B, or C," or a list of "one or more of A, B, or C" means A or B or C or AB or AC or BC or ABC (i.e., A and B and C), or combinations with more than one feature (e.g., AA, AAB, ABBC, etc.).

As used herein, unless otherwise stated, a statement that a function or operation is "based on" an item or condition means that the function or operation is based on the stated item or condition and may be based on one or more items and/or conditions in addition to the stated item or condition.

Further, an indication that information is sent or transmitted, or a statement of sending or transmitting information, "to" an entity does not require completion of the communication. Such indications or statements include situations where the information is conveyed from a sending entity but does not reach an intended recipient of the information. The intended recipient, even if not actually receiving the information, may still be referred to as a receiving entity, e.g., a receiving execution environment. Further, an entity that is configured to send or transmit information "to" an intended recipient is not required to be configured to complete the delivery of the information to the intended recipient. For example, the entity may provide the information, with an indication of the intended recipient, to another entity that is capable of forwarding the information along with an indication of the intended recipient.

Substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed.

The methods, systems, and devices discussed above are examples. Various configurations may omit, substitute, or add various procedures or components as appropriate. For instance, in alternative configurations, the methods may be performed in an order different from that described, and that various steps may be added, omitted, or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations provides a description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, many of the operations can be performed in parallel or concurrently. In addition, the order of the operations may be rearranged. A process may have additional stages or functions not included in the figure. Furthermore, examples of the methods may be implemented by hardware, software, firmware, middleware, microcode, hardware description languages, or any combination thereof. When implemented in software, firmware, middleware, or microcode, the program code or code segments to perform the tasks may be stored in a non-transitory computer-readable medium such as a storage medium. Processors may perform the described tasks.

Components, functional or otherwise, shown in the figures and/or discussed herein as being connected or communicating with each other are communicatively coupled. That is, they may be directly or indirectly connected to enable communication between them.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of operations may be undertaken before, during, or after the above elements are considered. Accordingly, the above description does not bound the scope of the claims.

Further, more than one invention may be disclosed.

The invention claimed is:

1. An apparatus for reducing an impact of ground noise on an auxiliary device power input, comprising:

an output jack including a ground pole and a power output pole;
a power supply circuit configured to generate a power signal;
a coupler circuit operably coupled to the ground pole and the power output pole of the output jack, the coupler circuit configured to couple the power signal with a noise signal on the ground pole to generate a combined output signal on the power output pole.

2. The apparatus of claim 1 wherein the power supply circuit includes a first Low Drop Out regulator (LDO) circuit and an output capacitor.

3. The apparatus of claim 2 wherein the coupler circuit includes a second LDO circuit operably coupled to an input of the first LDO circuit and the ground pole.

4. The apparatus of claim 1 wherein the output jack includes at least one audio signal pole.

5. The apparatus of claim 1 wherein the output jack is a 3.5 mm phono jack.

6. The apparatus of claim 1 further comprising a connector configured to couple to a mobile device, wherein the connector includes a ground line and a power input line.

7. The apparatus of claim 6 wherein the ground line is operably coupled to the ground pole of the output jack, and the power input line is operably coupled to the power supply circuit.

8. The apparatus of claim 1 wherein the power signal is digitally modulated such that a first voltage value represents a first binary value and a second voltage value represents a second binary value.

9. A method of providing power to an auxiliary device via a headphone output, comprising:
generating a power output voltage;
detecting a ground noise voltage on a ground pole of the headphone output;
coupling the ground noise voltage to the power output voltage;
generating a combined output based on the power output voltage and the ground noise voltage; and
providing the combined output to a microphone pole of the headphone output.

10. The method of claim 9 wherein generating the power output voltage includes controlling a reference voltage input with a first Low Drop Out regulator (LDO).

11. The method of claim 10, wherein the first LDO includes a negative feedback loop.

12. The method of claim 10 wherein generating the combined output includes providing an output of a second LDO as the reference voltage input to the first LDO, wherein the output of the second LDO is operably coupled to first LDO and the ground pole via a voltage divider.

13. The method of claim 9 further comprising providing an audio signal to the headphone output.

14. The method of claim 9 further comprising modulating the power output voltage, wherein a modulated power output includes at least a first voltage value to represent a first binary value and a second voltage value to represent a second binary value.

15. The method of claim 9 further comprising providing power to a mobile device via a connector using the combined output, wherein the connector includes a ground line and a power line.

16. The method of claim 15 wherein the headphone output is a 3.5 mm phono jack and the connector is compatible with a digital connection port.

17. An apparatus for providing power to an auxiliary device, comprising:
means for generating a power output voltage;
means for detecting a ground noise voltage on a ground pole of a headphone output;
means for coupling the ground noise voltage to the power output voltage;
means for generating a combined output based on the power output voltage and the ground noise voltage; and
means for providing the combined output to a microphone pole of the headphone output.

18. The apparatus of claim 17 wherein the means for generating the power output voltage includes controlling a reference voltage input with a first Low Drop Out regulator (LDO).

19. The apparatus of claim 18, wherein the first LDO includes a negative feedback loop.

20. The apparatus of claim 18 wherein the means for generating the combined output includes means for providing an output of a second LDO as the reference voltage input to the first LDO, wherein the output of the second LDO is operably coupled to first LDO and the ground pole via a voltage divider.

21. The apparatus of claim 17 further comprising means for providing an audio signal to the headphone output.

22. The apparatus of claim 17 further comprising means for modulating the power output voltage, wherein a modulated power output includes at least a first voltage value to represent a first binary value and a second voltage value to represent a second binary value.

23. The apparatus of claim 17 further comprising means for connecting to a mobile device with a connector, wherein the connector includes a ground line and a power line.

24. The apparatus of claim 17 further comprising means for transmitting data over the microphone pole, the means for transmitting data comprising a switched capacitor circuit.

25. An apparatus, comprising:
a jack comprising at least a first connection configured to couple to a ground and a second connection configured to couple to an output signal;
a low drop out regulator (LDO) configured to generate the output signal; and
circuitry configured to couple a signal at the first connection to an input of the LDO.

26. The apparatus of claim 25, wherein the LDO is configured to generate the output signal based on a reference voltage supplied at the input.

27. The apparatus of claim 26, further comprising a second LDO configured to supply the reference voltage.

28. The apparatus of claim 27, further comprising a first resistor coupled between an output of the second LDO and the input of the LDO, and a second resistor coupled between the first connection and the input of the LDO.

29. The apparatus of claim 25, further comprising an inductor coupled between an output of the LDO and the second connection.

30. The apparatus of claim 25, wherein the jack comprises a headphone jack, the first connection is configured to couple to a ground conductor in a headphone cable, and the second connection is configured to couple to a microphone conductor in the headphone cable.

* * * * *